(12) United States Patent
Avery et al.

(10) Patent No.: US 8,355,837 B2
(45) Date of Patent: Jan. 15, 2013

(54) SYSTEM AND METHOD FOR TESTING THE INTEGRITY OF A VEHICLE TESTING/DIAGNOSTIC SYSTEM

(75) Inventors: Donald Jackson Avery, Saint Charles, MO (US); Terry Edward Goretti, Arnold, MO (US)

(73) Assignee: Envirotest Systems Holdings Corp., East Granby, CT (US)

( * ) Notice: Subject to any disclaimer, the term of this patent is extended or adjusted under 35 U.S.C. 154(b) by 0 days.

(21) Appl. No.: 13/108,890

(22) Filed: May 16, 2011

(65) Prior Publication Data

US 2012/0016552 A1    Jan. 19, 2012

Related U.S. Application Data

(63) Continuation of application No. 11/506,000, filed on Aug. 18, 2006, now Pat. No. 7,945,358.

(60) Provisional application No. 60/709,117, filed on Aug. 18, 2005.

(51) Int. Cl.
*G06F 7/00*    (2006.01)
*G06F 19/00*    (2006.01)

(52) U.S. Cl. ............... 701/32.8; 701/29.1; 701/31.3; 701/33.1

(58) Field of Classification Search ............ None
See application file for complete search history.

(56) References Cited

U.S. PATENT DOCUMENTS

| | | | |
|---|---|---|---|
| 4,864,568 A | 9/1989 | Sato et al. | 371/8.2 |
| 4,962,456 A | 10/1990 | Abe et al. | 364/431.01 |
| 5,506,772 A | 4/1996 | Kubozono et al. | 364/424.03 |
| 5,541,840 A | 7/1996 | Gurne et al. | 364/424.03 |
| 5,548,713 A | 8/1996 | Petry et al. | 395/183.01 |
| 5,565,856 A | 10/1996 | Takaba et al. | 340/825.16 |
| 5,657,233 A | 8/1997 | Cherrington et al. | 364/464.1 |
| 5,717,595 A | 2/1998 | Cherrington et al. | 364/464.1 |
| 5,964,813 A * | 10/1999 | Ishii et al. | 701/29.2 |
| 5,995,898 A | 11/1999 | Tuttle | 701/102 |
| 6,070,155 A | 5/2000 | Cherrington et al. | 705/400 |
| 6,112,152 A | 8/2000 | Tuttle | 701/115 |
| 6,128,560 A * | 10/2000 | Ishii | 701/31.4 |
| 6,134,488 A * | 10/2000 | Sasaki et al. | 701/32.8 |
| 6,175,787 B1 * | 1/2001 | Breed | 701/29.2 |
| 6,181,992 B1 | 1/2001 | Gurne et al. | 701/29 |
| 6,192,302 B1 * | 2/2001 | Giles et al. | 701/29.6 |
| 6,233,509 B1 | 5/2001 | Becker | 701/29 |
| 6,263,268 B1 | 7/2001 | Nathanson | 701/29 |
| 6,282,469 B1 * | 8/2001 | Rogers et al. | 701/31.4 |
| 6,295,492 B1 | 9/2001 | Lang et al. | 701/33 |
| 6,308,130 B1 | 10/2001 | Vojtisek-Lom | 701/114 |

(Continued)

FOREIGN PATENT DOCUMENTS

WO    WO 99/22497    5/1999

(Continued)

*Primary Examiner* — Ian Jen
(74) *Attorney, Agent, or Firm* — Pillsbury Winthrop Shaw Pittman LLP

(57) ABSTRACT

A system and method for testing the integrity of a vehicle testing/diagnostic system is provided. Examples of vehicle testing/diagnostic systems may include any equipment (portable or stationary) found in an automotive maintenance and/or testing environment (or other environment) that is capable of communicating with vehicle on-board diagnostic (OBD) systems. Prior to conducting an OBD test on one or more vehicles, an integrity testing system interfaces with a vehicle testing/diagnostic system to determine whether the vehicle testing/diagnostic system is capable of communicating via one or more predetermined communications protocols.

16 Claims, 11 Drawing Sheets

U.S. PATENT DOCUMENTS

| | | | |
|---|---|---|---|
| 6,341,670 B1 | 1/2002 | Leblanc et al. | 188/1.11 L |
| 6,359,570 B1 | 3/2002 | Adcox et al. | 340/902 |
| 6,360,145 B1 * | 3/2002 | Robinson | 701/31.5 |
| 6,388,579 B1 | 5/2002 | Adcox et al. | 340/902 |
| 6,429,773 B1 | 8/2002 | Schuyler | 340/425.5 |
| 6,435,019 B1 | 8/2002 | Vojtisek-Lom | 73/118.1 |
| 6,442,458 B2 * | 8/2002 | Kubo et al. | 701/34.4 |
| 6,526,340 B1 | 2/2003 | Reul et al. | 701/29 |
| 6,535,112 B1 * | 3/2003 | Rothschink | 340/425.5 |
| 6,594,579 B1 | 7/2003 | Lowrey et al. | 701/123 |
| 6,601,441 B1 | 8/2003 | Torgerson et al. | 73/117 |
| 6,604,033 B1 | 8/2003 | Banet et al. | 701/33 |
| 6,609,051 B2 * | 8/2003 | Fiechter et al. | 701/29.3 |
| 6,611,740 B2 | 8/2003 | Lowrey et al. | 701/29 |
| 6,622,070 B1 * | 9/2003 | Wacker et al. | 701/31.4 |
| 6,623,975 B1 | 9/2003 | Tefft et al. | 436/137 |
| 6,630,885 B2 | 10/2003 | Hardman et al. | 340/505 |
| 6,633,784 B1 * | 10/2003 | Lovelace et al. | 700/65 |
| 6,636,790 B1 | 10/2003 | Lightner et al. | 701/33 |
| 6,647,420 B2 | 11/2003 | Hellbusch et al. | 709/226 |
| 6,650,977 B2 * | 11/2003 | Miller | 701/32.7 |
| 6,662,091 B2 | 12/2003 | Wilson et al. | 701/33 |
| 6,668,253 B1 | 12/2003 | Thompson et al. | 707/10 |
| 6,676,841 B2 * | 1/2004 | Akins et al. | 210/744 |
| 6,687,584 B2 | 2/2004 | Andreasen et al. | 701/29 |
| 6,701,233 B2 | 3/2004 | Namaky et al. | 701/29 |
| 6,728,611 B2 * | 4/2004 | Kamiya | 701/33.4 |
| 6,732,031 B1 | 5/2004 | Lightner et al. | 701/33 |
| 6,732,032 B1 | 5/2004 | Banet et al. | 701/33 |
| 6,735,630 B1 | 5/2004 | Gelvin et al. | 709/224 |
| 6,775,602 B2 * | 8/2004 | Gordon et al. | 701/29.6 |
| 6,785,605 B2 | 8/2004 | Huller et al. | 701/114 |
| 6,791,456 B2 | 9/2004 | Nakayama et al. | 340/429 |
| 6,799,106 B2 | 9/2004 | Fukushima et al. | 701/48 |
| 6,816,760 B1 * | 11/2004 | Namaky | 701/33.2 |
| 6,832,141 B2 * | 12/2004 | Skeen et al. | 701/31.4 |
| 6,836,708 B2 | 12/2004 | Tripathi | 701/29 |
| 6,868,388 B1 | 3/2005 | Millsap et al. | 705/7 |
| 6,876,296 B2 | 4/2005 | Talmadge et al. | 340/10.42 |
| 6,879,894 B1 | 4/2005 | Lightner et al. | 701/33 |
| 6,901,374 B1 | 5/2005 | Himes | 705/14 |
| 6,920,381 B2 | 7/2005 | Doherty et al. | 701/33 |
| 6,925,368 B2 | 8/2005 | Funkhouser et al. | 701/33 |
| 6,928,348 B1 * | 8/2005 | Lightner et al. | 701/31.5 |
| 6,928,349 B1 | 8/2005 | Namaky et al. | 701/33 |
| 6,941,203 B2 * | 9/2005 | Chen | 701/31.6 |
| 6,947,816 B2 * | 9/2005 | Chen | 701/33.5 |
| D510,287 S | 10/2005 | Chen et al. | D10/78 |
| 6,988,053 B2 | 1/2006 | Namaky | 702/183 |
| 7,061,371 B2 | 6/2006 | Shockley | 340/425.1 |
| 7,085,680 B2 | 8/2006 | Huang | 702/183 |
| 7,116,216 B2 | 10/2006 | Andreasen et al. | 340/438 |
| 7,124,051 B2 * | 10/2006 | Patterson et al. | 702/122 |
| 7,124,058 B2 * | 10/2006 | Namaky et al. | 702/183 |
| RE39,619 E | 5/2007 | Andreasen et al. | 701/29 |
| 7,239,946 B2 | 7/2007 | Sowa | 701/29 |
| 7,257,472 B2 * | 8/2007 | Hauer et al. | 701/32.7 |
| 7,945,358 B2 | 5/2011 | Avery et al. | 701/33 |
| 2002/0007237 A1 | 1/2002 | Phung et al. | 701/33 |
| 2002/0016655 A1 | 2/2002 | Joao | 701/35 |
| 2002/0024537 A1 | 2/2002 | Jones et al. | 345/763 |
| 2002/0087237 A1 * | 7/2002 | Ol et al. | 701/31 |
| 2002/0095321 A1 | 7/2002 | Hellbusch et al. | 705/7 |
| 2002/0116095 A1 | 8/2002 | Miller et al. | 701/1 |
| 2002/0123833 A1 * | 9/2002 | Sakurai et al. | 701/33 |
| 2002/0123933 A1 | 9/2002 | Himes | 705/17 |
| 2002/0133273 A1 | 9/2002 | Lowrey et al. | 701/29 |
| 2002/0150050 A1 | 10/2002 | Nathanson | 370/241 |
| 2002/0156692 A1 | 10/2002 | Squeglia et al. | 705/26 |
| 2002/0173885 A1 | 11/2002 | Lowrey et al. | 701/29 |
| 2002/0193925 A1 | 12/2002 | Funkhouser et al. | 701/33 |
| 2002/0197955 A1 | 12/2002 | Witkowski et al. | 455/41 |
| 2003/0004623 A1 | 1/2003 | Namaky et al. | 701/29 |
| 2003/0004624 A1 | 1/2003 | Wilson et al. | 701/33 |
| 2003/0060953 A1 | 3/2003 | Chen | 701/33 |
| 2003/0130774 A1 | 7/2003 | Tripathi et al. | 701/33 |
| 2003/0138475 A1 | 7/2003 | Chen | 424/435 |
| 2003/0158640 A1 | 8/2003 | Pillar et al. | 701/33 |
| 2003/0171111 A1 | 9/2003 | Clark | 455/414.1 |
| 2003/0187557 A1 * | 10/2003 | Shockley | 701/39 |
| 2003/0191660 A1 | 10/2003 | Himes | 705/1 |
| 2003/0228879 A1 | 12/2003 | Witkowski et al. | 455/550.1 |
| 2003/0236601 A1 * | 12/2003 | McLeod et al. | 701/29 |
| 2004/0002921 A1 | 1/2004 | Himes | 705/65 |
| 2004/0015278 A1 | 1/2004 | Gordon, Jr. et al. | 701/33 |
| 2004/0039502 A1 | 2/2004 | Wilson et al. | 701/29 |
| 2004/0039646 A1 | 2/2004 | Hacker | 705/22 |
| 2004/0044453 A1 | 3/2004 | Malik et al. | 701/33 |
| 2004/0048622 A1 | 3/2004 | Witkowski et al. | 455/456.6 |
| 2004/0110472 A1 | 6/2004 | Witkowski et al. | 455/41.2 |
| 2004/0203379 A1 | 10/2004 | Witkowski et al. | 455/41.2 |
| 2005/0010341 A1 * | 1/2005 | MacNamara et al. | 701/33 |
| 2005/0015278 A1 | 1/2005 | Ghouri | 705/2 |
| 2005/0043868 A1 | 2/2005 | Mitcham | 701/29 |
| 2005/0043869 A1 | 2/2005 | Funkhouser et al. | 701/29 |
| 2005/0075768 A1 * | 4/2005 | Nicholson et al. | 701/29 |
| 2005/0096806 A1 | 5/2005 | Diem | 701/29 |
| 2005/0119809 A1 | 6/2005 | Chen | 701/33 |
| 2005/0125117 A1 | 6/2005 | Breed | 701/29 |
| 2005/0131596 A1 | 6/2005 | Cherrington et al. | 701/29 |
| 2005/0143882 A1 | 6/2005 | Umezawa | 701/29 |
| 2005/0159923 A1 | 7/2005 | Huang | 702/183 |
| 2005/0171735 A1 | 8/2005 | Huang | 702/183 |
| 2005/0177286 A1 | 8/2005 | Namaky et al. | 701/33 |
| 2005/0182535 A1 | 8/2005 | Huang | 701/29 |
| 2005/0182537 A1 | 8/2005 | Tefft et al. | 701/29 |
| 2006/0027650 A1 | 2/2006 | Andreasen et al. | 235/384 |
| 2006/0089767 A1 * | 4/2006 | Sowa | 701/29 |
| 2006/0089768 A1 * | 4/2006 | Sakurai et al. | 701/29 |
| 2006/0149434 A1 * | 7/2006 | Bertosa et al. | 701/29 |
| 2006/0149437 A1 * | 7/2006 | Somos | 701/29 |
| 2006/0167593 A1 | 7/2006 | Eckles | 701/1 |
| 2006/0293811 A1 | 12/2006 | Andreasen et al. | 701/29 |
| 2007/0005201 A1 | 1/2007 | Chenn | 701/29 |
| 2007/0016483 A1 | 1/2007 | Chenn | 705/26 |
| 2007/0043488 A1 | 2/2007 | Avery et al. | 701/33 |

FOREIGN PATENT DOCUMENTS

| | | |
|---|---|---|
| WO | WO 00/79727 | 12/2000 |
| WO | WO 01/84380 | 11/2001 |
| WO | WO 01/86576 | 11/2001 |

* cited by examiner

SYSTEM AND METHOD FOR TESTING THE INTEGRITY OF A VEHICLE TESTING/DIAGNOSTIC SYSTEM

CROSS-REFERENCE TO RELATED APPLICATIONS

This application is a continuation of U.S. patent application Ser. No. 11/506,000, filed Aug. 18, 2006, and issued as U.S. Pat. No. 7,945,358 on May 17, 2011, which claims priority to U.S. Provisional Patent Application Ser. No. 60/709,117, filed Aug. 18, 2005, which is incorporated herein by reference in its entirety.

FIELD OF THE INVENTION

The invention relates to testing the integrity of a vehicle testing/diagnostic system used to communicate with an on board diagnostic system of a vehicle.

BACKGROUND OF THE INVENTION

The Environmental Protection Agency (EPA) requires vehicle manufacturers to install on-board diagnostic (OBD) systems for emission control on their light-duty automobiles and trucks beginning with model year 1996. OBD systems typically monitor vehicle emission control systems to detect any malfunction or deterioration that may cause emissions to exceed certain thresholds, such as state-mandated emission requirements or other thresholds. In conventional OBD systems, all (or substantially all) information monitored and/or calculated by an OBD system may be made available through a standardized, serial 16 cavity connector referred to as a Data Link Connector (DLC). The physical and electrical characteristics of typical DLCs provided on vehicles may be standard for all vehicles sold in the United States after 1996.

Generally, a variety of vehicle functions may be monitored by a vehicle's OBD system and, based on observed irregularities in the monitored functions, the OBD system may set one or more "trouble codes" that indicate a specific mechanical or electrical problem with the vehicle (e.g., an emission threshold has been exceeded). Via the DLC, the trouble codes currently set on the OBD may be accessed for any number of applications such as, for example, emissions testing, maintenance, repair diagnostics, or other applications. In some known diagnostic and testing systems, a vehicle testing/diagnostic system may be connected with the OBD to access the trouble codes. The vehicle testing/diagnostic system may be connected with the OBD by way of a serial 16 pin connector, or DLC, that corresponds to the serial 16 cavity DLC provided on the vehicle.

Known emission testing systems exist in which a vehicle may enter a testing station where a vehicle testing/diagnostic system may be connected via a DLC with an OBD system in the vehicle. Based on the trouble codes currently set in the OBD, the vehicle testing/diagnostic system may classify the vehicle as a "pass" or a "fail". However, should the vehicle testing/diagnostic system be unable to communicate with the OBD upon connection due to a malfunction associated with the OBD system, or for other reasons, the vehicle may be classified as a "fail." Some conventional emission testing systems may be incapable of detecting instances wherein a failure to communicate between the vehicle testing/diagnostic system and the OBD may be caused by a malfunction associated with the testing station (e.g., a faulty DLC associated with the vehicle testing/diagnostic system) rather than a malfunction associated with the OBD system. Consequently, in cases wherein a malfunction may be present at the testing station, vehicles may be incorrectly classified as "fails" with respect to meeting emissions standards. Similarly, known diagnostic systems may not be capable of determining instances in which a failure to communicate with an OBD system may be due to faulty diagnostic equipment, as opposed to a faulty OBD system. These and other drawbacks exist with conventional diagnostic and testing systems that communicate with OBD systems.

SUMMARY OF THE INVENTION

The invention solving these and other problems relates to a system and method for testing the integrity of a vehicle testing/diagnostic system that is used to communicate with an OBD system of a vehicle.

Examples of vehicle testing/diagnostic systems may include any equipment (portable or stationary) found in an automotive maintenance and/or testing (e.g., centralized or decentralized) environment (e.g., a test lane, garage bay, open-air test area, etc.) or other environment capable of communicating with vehicle on-board diagnostic (OBD) systems. Prior to conducting an OBD test on one or more vehicles, an integrity testing system interfaces with a vehicle testing/diagnostic system to determine whether the vehicle testing/diagnostic system is capable of communicating via one or more predetermined communications protocols.

One aspect of the invention relates to enabling an integrity testing system to interface with a vehicle testing/diagnostic system in substantially the same manner as a vehicle would so as to determine whether the vehicle testing/diagnostic system itself is functioning properly with respect to one or more predetermined communications protocols.

According to one implementation, the integrity testing system may comprise a connector, a receiving module, a determination module, a results/display module, reset module, and/or a power module. Additional modules may be implemented. In certain implementations, not all modules may be utilized.

The connector (of the integrity testing system) may be configured to interface with the vehicle testing/diagnostic system just as a connector associated with a vehicle OBD system would.

Via the connector, the receiving module (of the integrity testing system) may receive signals transmitted by the vehicle testing/diagnostic system. In some instances, these signals may be part of a "hand-shaking" routine used by the vehicle testing/diagnostic system to determine in which communications protocol(s) a given OBD system is capable of communicating. The receiving module may group the signals according to the one or more predetermined communications protocols.

Based on the signals received (and/or grouped) by the receiving module, the determination module may determine whether the vehicle testing/diagnostic system is capable of communicating via one or more predetermined communications protocols based on the received signals.

The results/display module may convey one or more of the determinations made by the determination module to a user.

Various phenomena may preclude vehicle testing/diagnostic systems from communicating in one or more predetermined communications protocols. For example, an equipment malfunction (e.g., a broken hardware component such as a broken pin or cavity, a shorted or open connection, other broken hardware components, etc.), a software and/or firmware malfunction, or other malfunctions may disable the vehicle testing/diagnostic system with respect to individual ones of the one or more predetermined communications protocols. In some cases, a malfunction of the vehicle testing/diagnostic system may disable the vehicle testing/diagnostic system with respect to some, but not all, of the predetermined communications protocols. By utilizing the integrity testing system of the invention, a vehicle testing/diagnostic system may be tested to determine whether the vehicle testing/diagnostic system is capable of communicating via any or all of the one or more predetermined communications protocols.

In some implementations, the connector (of the integrity testing system) may be formed similarly to a standard connector of a vehicle OBD system. For example, the connector may comprise a sixteen cavity data link connector similar in structure and function to a data link connector of a vehicle OBD system.

Each of the one or more predetermined protocols may not implement all of the connections (e.g., pins, cavities, etc.) formed between the vehicle testing/diagnostic system and the integrity testing system via the connector. As such, the receiving module may group the signals transmitted by the vehicle testing/diagnostic system via the connector in accordance with the one or more predetermined communications protocols. For example, in instances wherein the connector includes a standard sixteen cavity data link connector, if a given communications protocol implements only cavities 4 and 12, then the receiving module may group the signals received by the integrity system on cavities 4 and 12 of the connector.

Based on the signals received by the receiving module, the determination module may determine whether the vehicle testing/diagnostic system is capable of communicating via the one or more predetermined communications protocols. For instance, in the example of the given communications protocol that implements cavities 4 and 12, if the receiving module receives signals from the vehicle testing/diagnostic system via cavities 4 and 12 of the connector, then the determination module may determine that the vehicle testing/diagnostic system is capable of communicating via this given communications protocol. However, if a second given communications protocol implements cavities 3 and 8, and the receiving module does not receive a signal from the vehicle testing/diagnostic system via cavity 8, then the determination module may determine that the vehicle testing/diagnostic system is not capable of communicating via the second communications protocol.

The results/display module may convey the determinations of the determination module to a user. For example, the results module may graphically display (e.g., via one or more lights, a display screen, or other visual display) the determinations of the determination module. In other implementations, the results/display module may use other mechanisms for conveying the determinations (e.g., sounds, etc.). In some instances, the results/display module may convey a determination about each of the predetermined communications protocols separately. For instance, in the example provided above, the results/display module may convey that the vehicle testing/diagnostic system is capable of communicating via the first given communications protocol but is not capable of communicating via the second given protocol.

In some implementations, the results/display module may convey an overall determination that is an aggregation of the individual determinations. For example, the overall determination for the example described above might be that the vehicle testing/diagnostic system is not capable of communicating in the predetermined communications protocols. This overall determination would change if the determination module determined that the vehicle testing/diagnostic system was capable of communicating via the second given communications protocol. Thus, the results/display module may provide the user with an indication as to which communications protocols the vehicle testing/diagnostic system is or is not capable of communicating in, and/or an indication of the overall ability of the vehicle testing/diagnostic system to communicate with vehicle OBD systems in the predetermined communications protocols.

The various objects, features, and advantages of the invention will be apparent through the detailed description of the invention and the drawings attached hereto. It is also to be understood that both the foregoing general description and the following detailed description are exemplary and not restrictive of the scope of the invention.

DETAILED DESCRIPTION OF THE INVENTION

Figure 1:
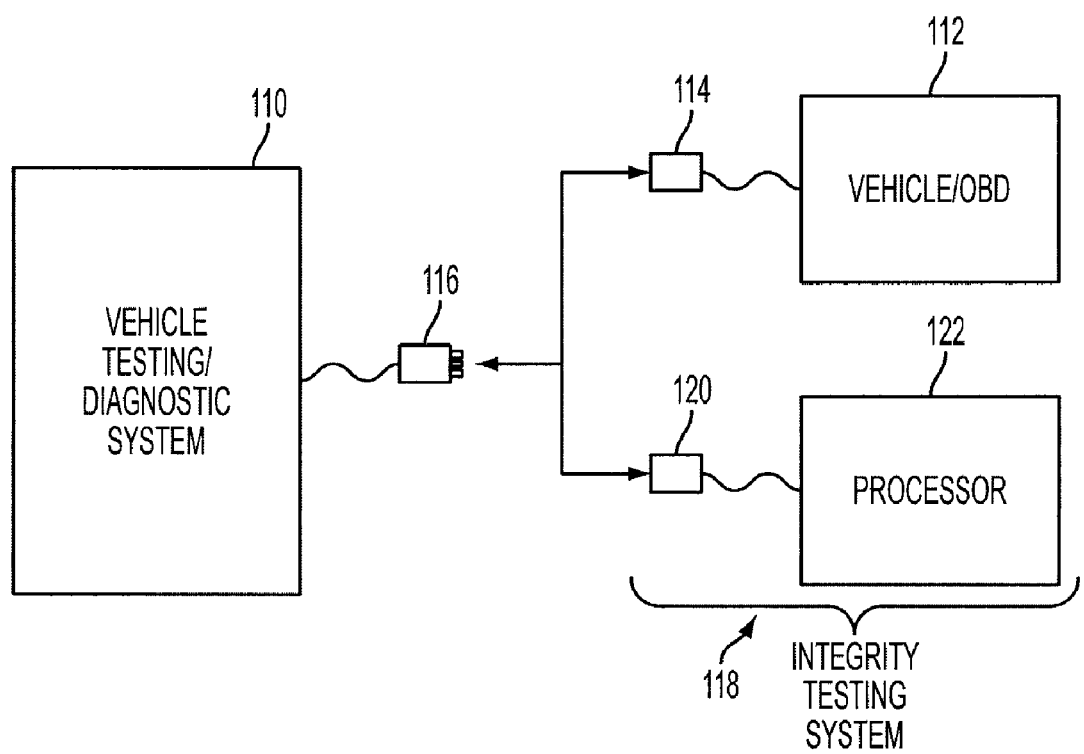
FIG. 1 is an exemplary illustration of a vehicle testing/diagnostic system, an OBD system and an integrity testing system, according to an aspect of the invention.

FIG. 1 illustrates a vehicle testing/diagnostic system 110 capable of communicating with an OBD system 112 on board a vehicle.

Vehicle testing/diagnostic system 110 may, for example, comprise any equipment (portable or stationary) found in an automotive maintenance and/or testing (e.g., centralized or decentralized) environment (e.g., a test lane, garage bay, open-air test area, etc.) or other environment capable of communicating with an OBD system.

Vehicle OBD system 112 may include a sixteen cavity data link connector 114. System 110 may include a sixteen pin data link connector 116 capable of interfacing with connector 114 to form an operative communication link between system 110 and vehicle OBD system 112. Information may be transmitted over this communications link from vehicle OBD system 112 to system 110, or vice versa. The information transmitted to system 110 may include trouble codes that are set and/or not set on vehicle OBD system 112, diagnostic information, emissions information, or other information. In some implementations, system 110 may include an emissions testing system capable of receiving the information from vehicle OBD system 112 and classifying the vehicle as a "pass" or a "fail" based on the information. In some instances, if system 110 cannot communicate with vehicle OBD system 112, the vehicle may be classified as a "fail." In other implementations, system 110 may include a vehicle diagnostic system capable of receiving the information from vehicle OBD system 112, and determining or identifying needed and/or received maintenance and/or repair based on the information.

When systems 110 and 112 are initially connected via connectors 116 and 114, respectively, systems 110 and 112 may engage in a "hand-shaking" routine wherein signals may be transmitted from system 110 to system 112, or vice versa. The signals transmitted between systems 110 and 112 may include digital signals. The "hand-shaking" routine may enable each of systems 110 and 112 to establish that a valid connection exists between connectors 114 and 116.

Communications between systems 110 and 112 may be made by implementing a predetermined communications protocol. Examples of the communications protocols may include a controller area network (CAN) protocol, an international standards organization (ISO) protocol, a keyword protocol (KWP), a variable pulse width (VPW) protocol, a pulse width modulated (PWM) protocol, or other protocols. The protocol implemented in a particular communications session between systems 110 and 112 may be dictated by vehicle OBD system 112. In some instances, vehicle OBD system 112 may be incapable of communicating in more than one protocol, while system 110 may be capable of communicating via a plurality of protocols. System 110 may determine in which protocol (or protocols) vehicle OBD system 112 is capable of communicating during a "hand-shaking" routine that is initiated upon connection of connectors 114 and 116.

Figure 2:
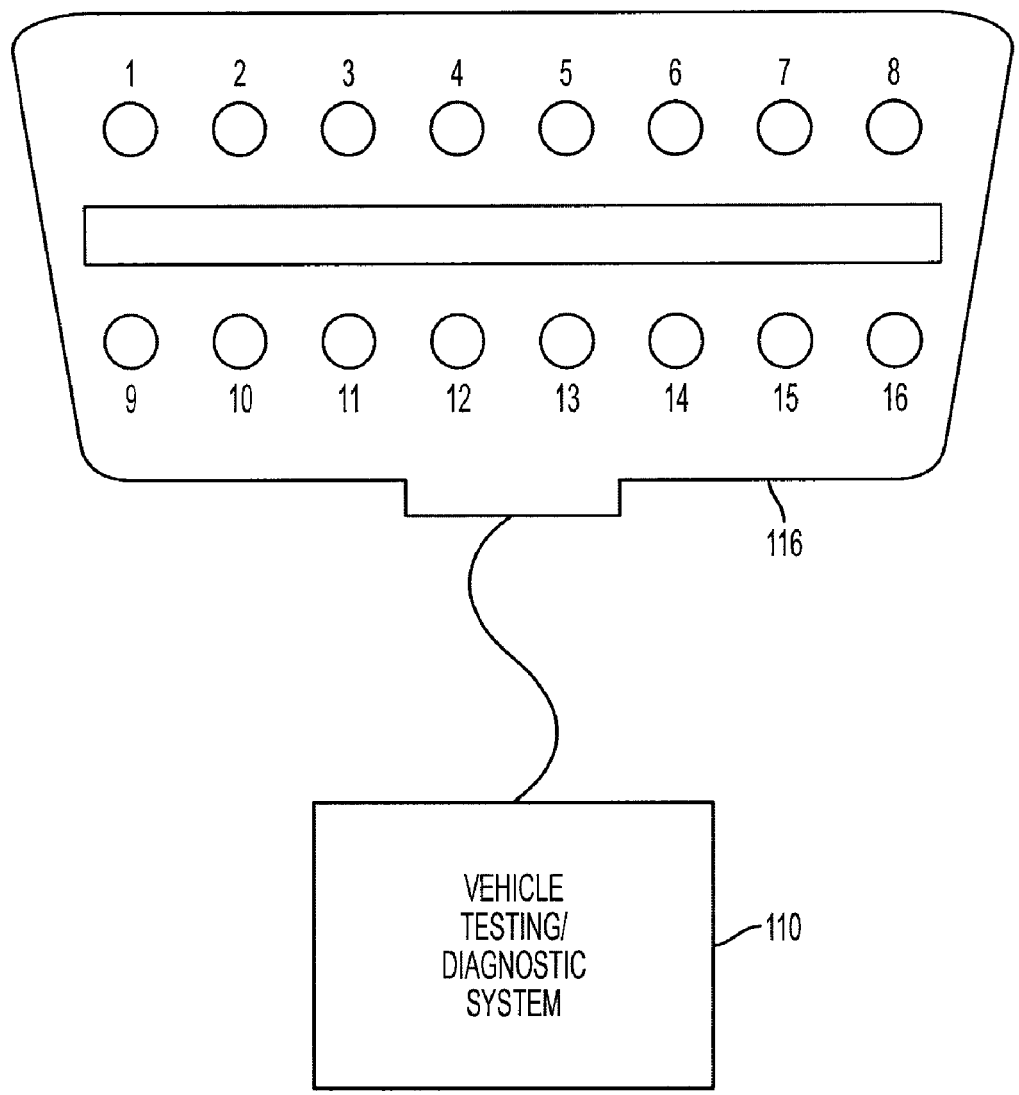
FIG. 2 is an exemplary illustration of a vehicle testing/diagnostic system, according to an aspect of the invention.

FIG. 2 is an exemplary illustration of vehicle testing/diagnostic system 110 along with an enhanced view of data link connector 116, according to an aspect of the invention. FIG. 2 depicts sixteen pins (shown as pins 1-16) included in connector 116. During communication between systems 110 and 112, it is not uncommon for various protocols to not utilize all of pins 1-16 on connector 116 (and corresponding cavities 1-16 on connector 114) to transmit information. Further, those pins (and cavities) that are used to communicate information may vary from session to session based on the particular protocol being implemented. For example, for CAN protocol, pins 6 and 14 may be used to communicate information, while pin 5 may be used as ground and pin 16 may be used to transmit power. For ISO and KWP protocols, pins 7 and 15 may be used to communicate information, while pin 5 may be used as ground, and pin 16 may be used to transmit power. For VPW protocol, pin 2 may be used to communicate information, while pin 5 may be used as ground, and pin 16 may be used to transmit power. For PWM protocol, pins 2 and 10 may be used to communicate information, while pin 5 may be used as ground and pin 16 may be used to transmit power.

As recited above, in those instances when systems 110 and 112 are unable to communicate via the interface between connectors 114 and 116, the vehicle associated with vehicle OBD system 112 may be classified as a "fail," for emissions testing purposes. However, the inability of systems 110 and 112 to communicate may not be the "fault" of vehicle OBD system 112, but instead may be caused by an inability of system 110 to send and/or receive information via connector 116. For example, system 110 may experience an equipment malfunction (e.g., a broken hardware component such as a broken pin or cavity, a shorted or open connection, other broken hardware components, etc.). System 110 may also experience a software and/or firmware malfunction, or other malfunctions that may result in the inability of systems 110 and 112 to communicate.

According to one implementation of the invention (and with reference to FIG. 1), an integrity testing system 118 may test vehicle testing/diagnostic system 110 to ensure that system 110 is capable of sending information through, and/or receiving communication from connector 116. As depicted in FIG. 1, integrity testing system 118 may comprise a data link connector 120 and a processor 122. Connector 120 may be capable of interfacing with connector 116, and processor 122 may be capable of determining whether system 110 is capable of sending and/or receiving information via connector 116 according to one or more protocols. For example, when connector 120 is connected to connector 116, system 110 may perceive integrity testing system 118 as an OBD system (such as that typically associated with a vehicle to be tested), and may initiate a "hand-shaking" routine to establish communication with the perceived OBD system, and/or to determine in which communication protocol(s) the perceived OBD system is capable of communicating. Based on the signals received by integrity testing system 118 from system 110 during this "hand-shaking" routine, processor 122 may determine whether system 110 is functioning properly with respect to one or more communication protocols, and may report the results to a user.

Figure 3:
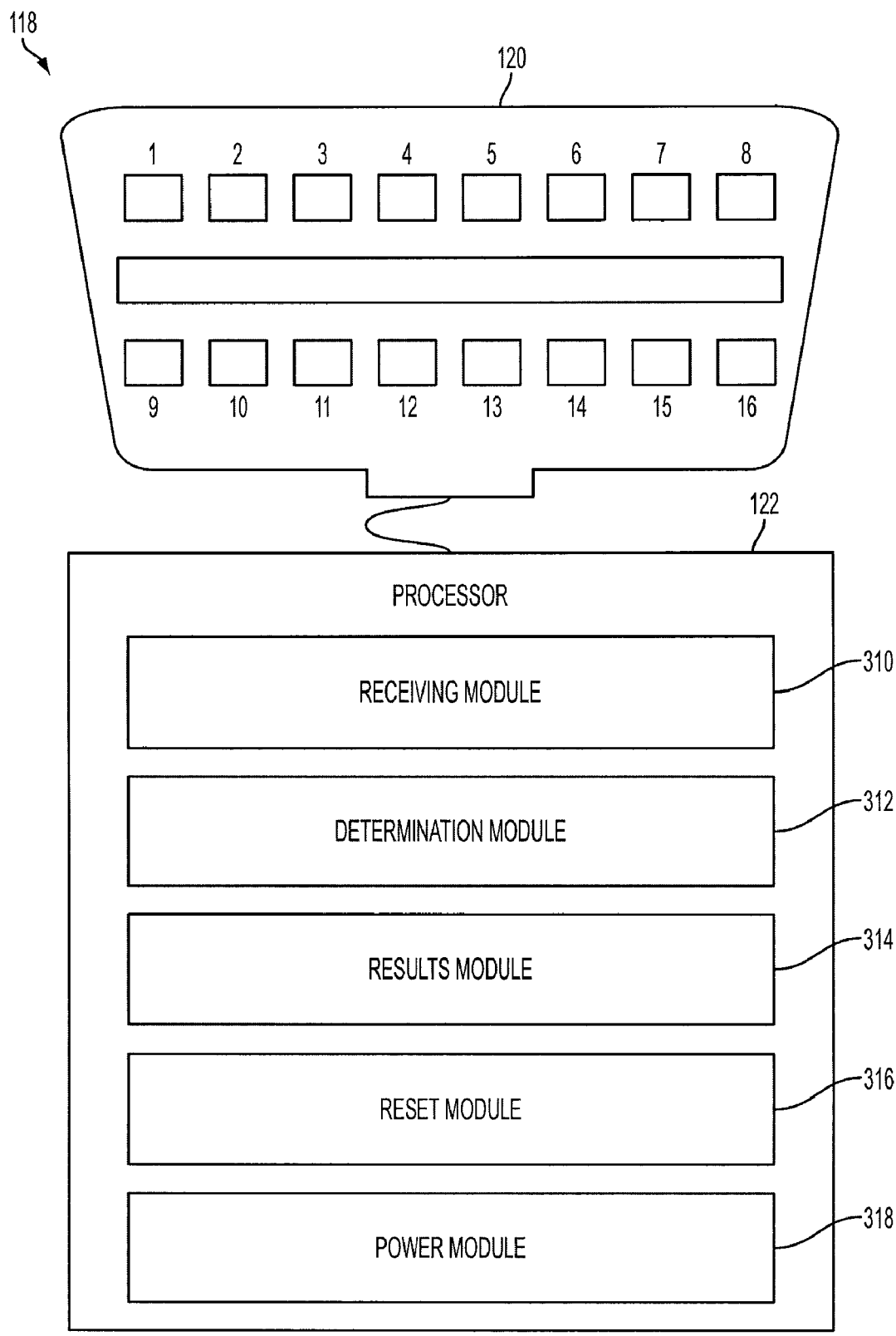
FIG. 3 is an exemplary illustration of an integrity testing system, according to an aspect of the invention.

FIG. 3 is an exemplary illustration of integrity testing system 118, according to one implementation of the invention. A connector 120 associated with integrity testing system 118 may include a sixteen cavity data link connector similar in structure and function to connector 114 of vehicle OBD system 112. Although processor 122 may be illustrated as a single component in FIGS. 1 and 3, it should be appreciated that processor 122 may include a plurality of processors connected via one or more operative links. In some embodiments, the plurality of processors may be located centrally in a single location. In other embodiments, one or more of the plurality of processors may be located remotely from one another. The operative links between the plurality of processors may include a communications link, such as a wired or wireless communications link, and may include a connection established over a network or via a direct connection. Other operative links may be implemented.

According to one aspect of the invention, processor 122 (of integrity testing system 118) may comprise a receiving module 310, a determination module 312, a results/display module 314, a reset module 316, and a power module 318, among other modules. It should be appreciated that the representation of modules 310, 312, 314, 316, and 318 are provided for illustrative purposes only, and that each module may include one or more components that perform the functionalities assigned to modules 310, 312, 314, 316, and 318, as well as other functions. Modules 310, 312, 314, 316, and 318 may include components implemented as hardware, software, firmware, a combination of hardware, software, and/or firmware, as well as in other mediums.

According to an aspect of the invention, receiving module 310 may receive signals from connector 120. The signals may include digital signals received by cavities 1-16 from pins 1-16 of connector 114 during a "hand-shaking" routine, or at another time. Receiving module 310 may group the received signals based on protocol usage. For example, in different implementations: (1) signals received at cavities 2 and 5 may be grouped together in accordance with their use as data signals within the VPW protocol; (2) signals received at cavities 2 and 10 may be grouped together in accordance with their use as data signals within the PWM protocol; (3) signals received at cavities 6 and 14 may be grouped together in accordance with their use as data signals in the CAN protocol; and (4) signals received at cavities 7 and 15 may be grouped together in accordance with their use as data signals in the ISO and KWP protocols.

In some implementations, determination module 312 may determine whether system 110 is capable of communicating with vehicle OBD system 112 via one or more communication protocols. Determination module 312 may receive the grouped signals from receiving module 310 and, based on the grouped signals, may determine whether system 110 is capable of communicating with vehicle OBD system 112 via the communication protocols. For example, from the grouped signals received at cavities 2 and 5, determination module 312 may determine whether system 110 is capable of communicating via the VPW protocol. Based on this determination, determination module 312 may generate one or more outputs.

According to an aspect of the invention, results/display module 314 may receive outputs from determination module 312, and may convey the results of the determination (or determinations) made by determination module 312 to a user. In some implementations, results/display module 314 may comprise a visual display that conveys the results to the user. Other means of conveying results may be utilized.

According to an aspect of the invention, reset module 316 may enable processor 122 to be reset to begin a new test of the integrity of system 110. Via reset module 316, one or both of determination module 312 and results module 314 may be reset for a new test.

According to one aspect of the invention, power module 318 may provide power to one or more of the modules 310, 312, 314, and 316, as well as other modules within processor 122. In some implementations, power module 318 may include a battery that may provide the power. In these implementations, power module 318 may include a low battery indicator that indicates that a power level of the battery is low. In some implementations, power module 318 may include a power connector for connecting processor 122 and/or the battery to an external power source. Power module 318 may comprise a recharging circuit for recharging the battery via the external power source.

Figure 4:
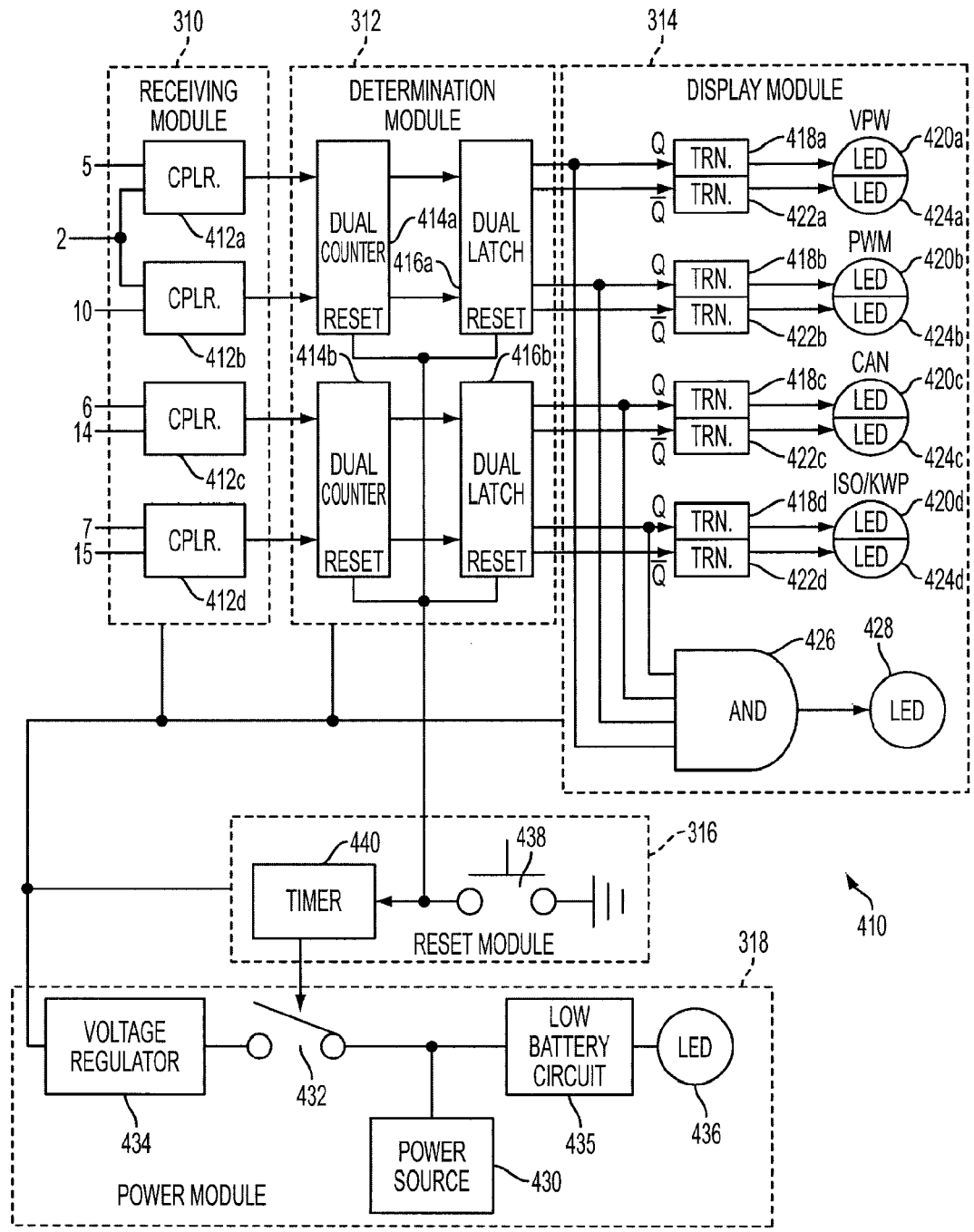
FIG. 4 is an exemplary schematic representation of a processor associated with an integrity testing system, according to an aspect of the invention.

FIG. 4 is an exemplary schematic representation of processor 122, according to one implementation. As shown, processor 122 may include a circuit 410. Circuit 410 may comprise receiving module 310, as described above. Receiving module 310 may include one or more signal couplers 412 (illustrated as signal couplers 412a-412d). Signal couplers 412 may include optocouplers for grouping sets of signals received at the various cavities of connector 120, as described previously. In FIG. 4, incoming signals have been labeled according to the cavity number at which the signal may have been received.

Figure 5A:
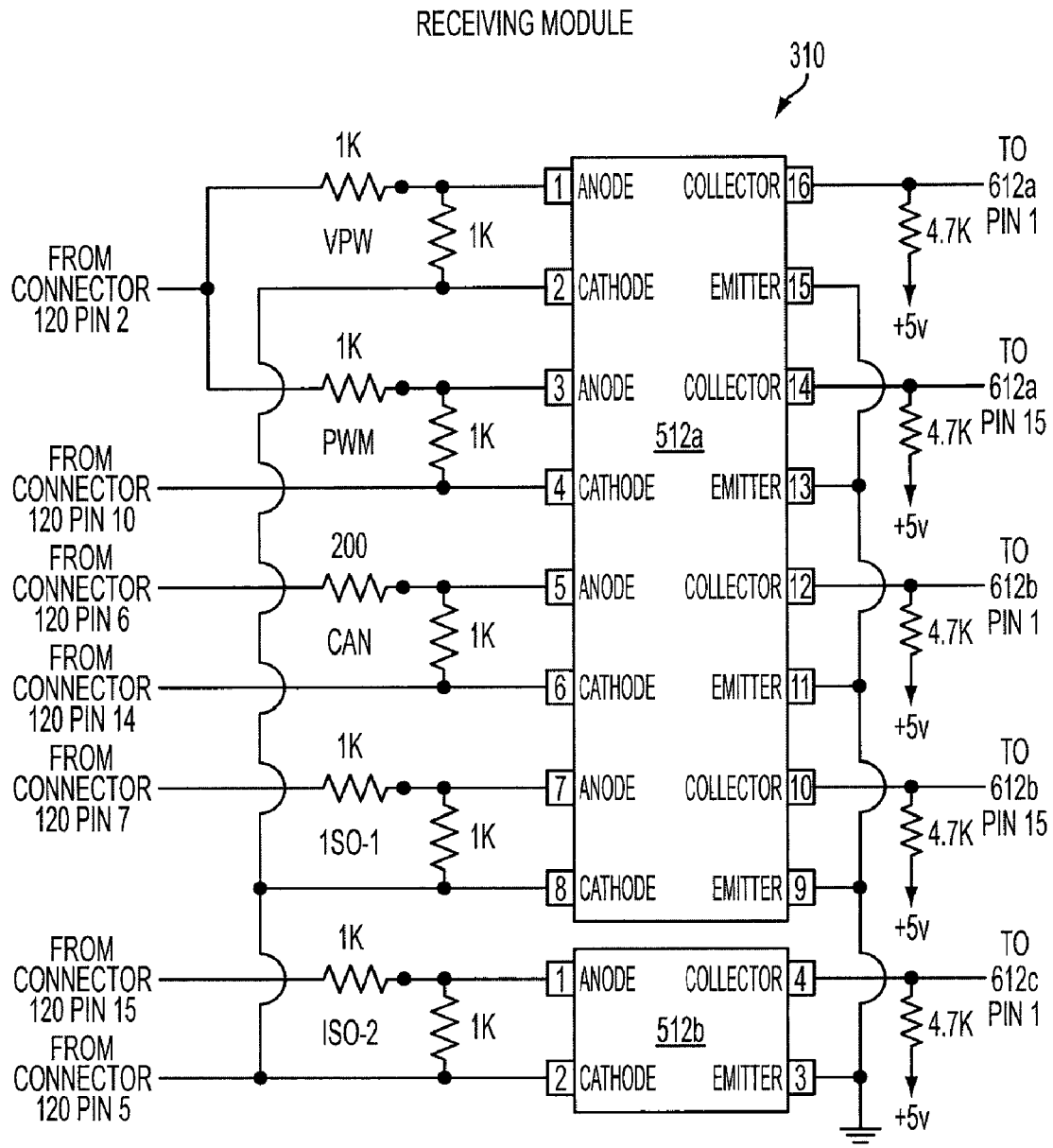
FIG. 5A is an exemplary schematic representation of a wiring diagram of a receiving module associated with an integrity testing system, according to an aspect of the invention.

FIG. 5A is an illustration of an exemplary wiring diagram of receiving module 310, according to one implementation of the invention. Signal couplers 412 of receiving module 310 (FIG. 4) may be provided by one or more optocoupler chips 512 (illustrated in FIG. 5A as first optocoupler chip 512a and second optocoupler chip 512b). In the representation illustrated in FIG. 5A, first optocoupler chip 512a may include a quad channel optocoupler, such as quad channel optocoupler OCP-PCT4116/E. Second optocoupler chip 512b may include a single channel optocoupler chip, such as single channel optocoupler chip PS2501-1. It should be appreciated that the implementation of receiving module 310 illustrated in FIG. 5A includes one more coupler than the implementation illustrated in FIG. 4. This discrepancy is representative of the fact that in different implementations of receiving module 310, more or less optocouplers may be used to test a vehicle testing/diagnostic system with respect to more or less communications protocols.

Figure 5B:
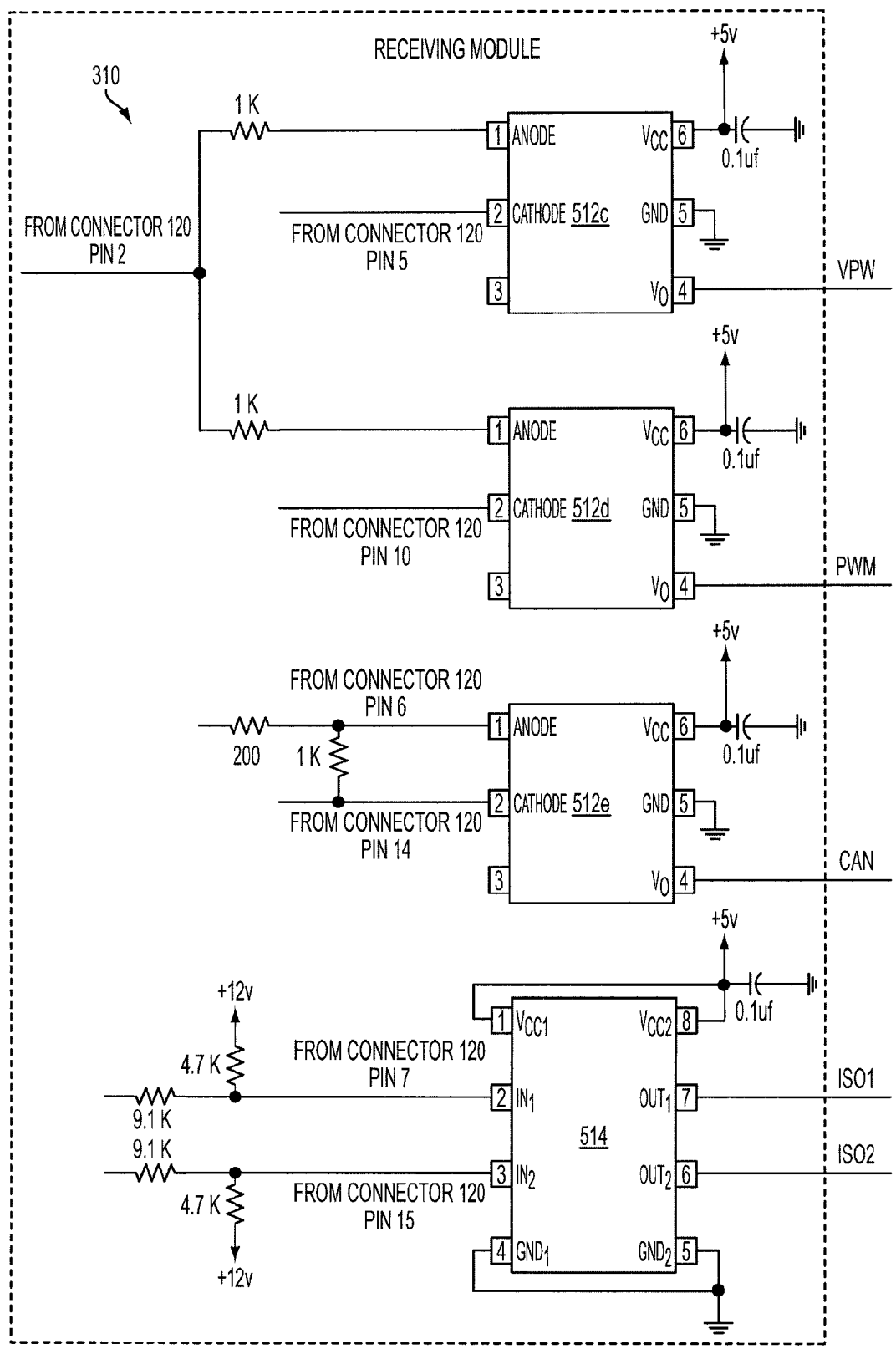
FIG. 5B is an exemplary schematic representation of a wiring diagram of a receiving module associated with an integrity testing system, according to an aspect of the invention.

FIG. 5B is an illustration of another exemplary wiring diagram of receiving module, in accordance with one implementation of the invention. In the implementation illustrated in FIG. 5B, signal couplers 412 (FIG. 4) may include optocouplers provided by one or more optocoupler chips 512 (illustrated in FIG. 5B as first optocoupler chip 512c, second optocoupler chip 512d, and third optocoupler chip 512e) and one or more magnetic couplers provided by one or more magnetic coupler chips 514. Optocoupler chips 512 may include opto isolators with Schmitt output H11L1. Magnetic coupler chip 514 may include a magnetic isolator IL710.

Figure 6:
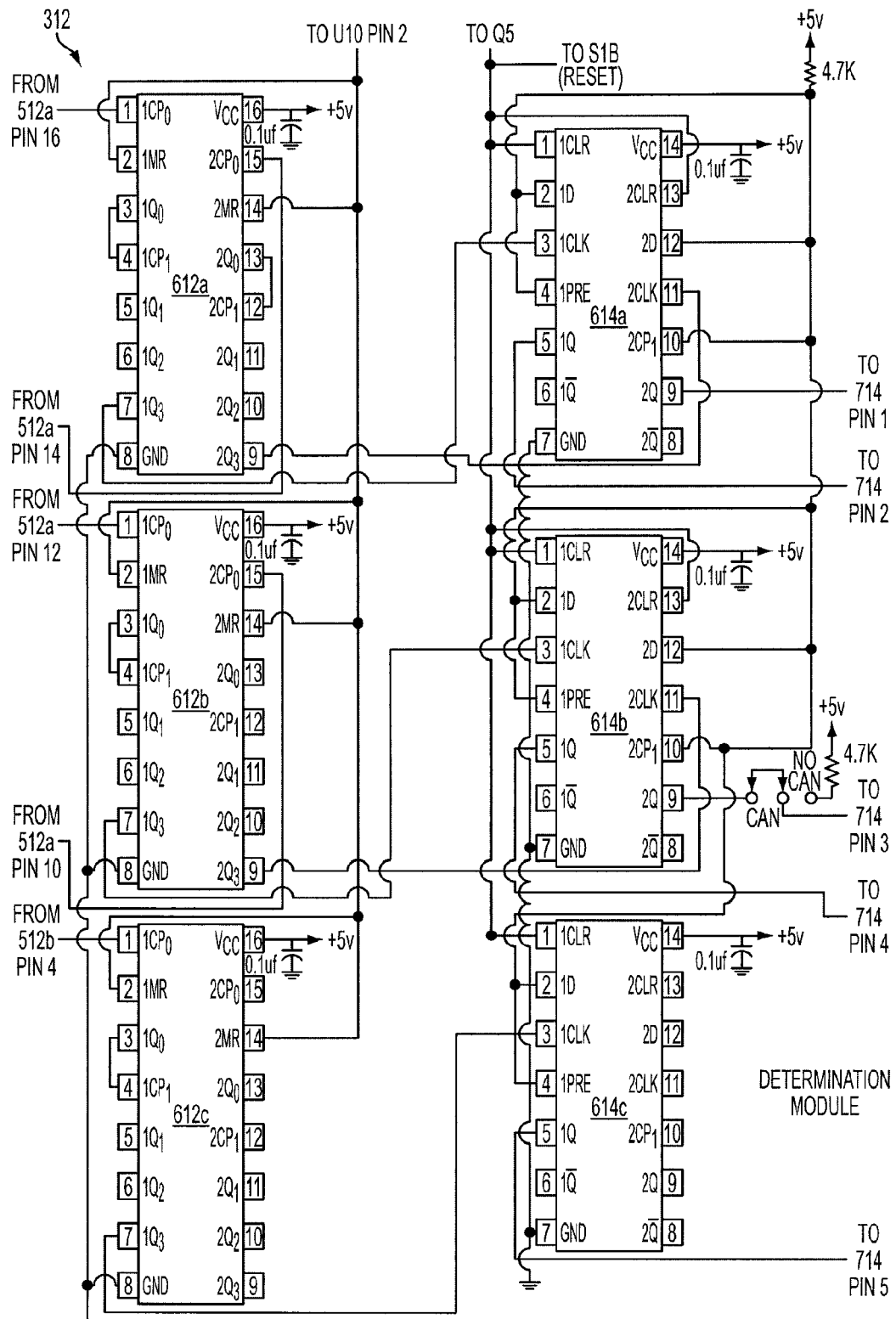
FIG. 6 is an exemplary schematic representation of a wiring diagram of a determination module associated with an integrity testing system, according to an aspect of the invention.

Referring back to FIG. 4, in some implementations, the grouped signals may be transmitted from signal couplers 412 to determination module 312. Determination module 312 may comprise one or more digital counters 414 (illustrated as dual digital counters 414a and 414b). Based on the grouped signals, each of digital counters 414 may provide a counter output to a latch 416 (illustrated as dual latches 416a and 416b). Based on the received counter output, each of the latches 416 may generate a determination output and an inverse of the determination output. When integrity testing system 118 is activated, the determination outputs may begin in a default state (e.g., high or low). As the grouped signals enter determination module 312, the counter outputs from digital counters 414 may trigger latches 416 to switch out of their default state. The inverses of the determination outputs occupy the opposite states from their corresponding determination outputs. For each latch 416, the corresponding digital counter 414 may trigger latch 416 to switch out of its default state when the grouped signal received at the digital counter 414 indicates that system 110 may be capable of communicating across the cavities in connector 120 at which the signals were received by integrity testing system 118. (51) FIG. 6 is an illustration of an exemplary wiring diagram of determination module 312 according to one implementation of the invention. As illustrated in FIG. 6, dual counters 414 of determination module 312 may include dual decade counters 612 (illustrated as first dual decade counter 612a, second dual decade counter 612b, and third dual decade counter 612c). In some implementations, dual decade counters 612 may include 74HC390 dual decade counters. As is indicated in the wiring diagram, determination module 312 of FIG. 6 may be adapted to operate with receiving module 310 illustrated in FIG. 5. As such, to accommodate the additional set of grouped signals provided by receiving module 310 in FIG. 5 (in comparison with receiving module 310 of FIG. 4), determination module 312 of FIG. 6 may include an additional dual decade counter 612 when compared with the representation of determination module 312. Dual latches 416 of determination module 312 may include dual flip-flops 614 (illustrated as first dual flip-flop 614a, second dual flip-flop 614b, and third dual flip-flop 614c). In one implementation, dual flip-flops 614 may include dual flip-flops with reset 74LS74.

Referring back to FIG. 4, display module 314 may include one or more driving transistors 418 (illustrated as driving transistors 418a-418d) that may drive one or more "go" LEDs 420 (illustrated as "go" LEDs 420a-420d), and one or more driving transistors 422 (illustrated as driving transistors 422a-422d) that may drive one or more "no-go" LEDs 424 (illustrated as "no-go" LEDs 424a-424d). Transistors 418 may receive the determination outputs, and may drive "go" LEDs 420 accordingly. Based on the inverses of the determination outputs, transistors 422 may drive "no-go" LEDs 424.

For example, when the determination outputs are in their default state, transistors 418 may not drive "go" LEDs 420 so that "go" LEDs 420 may not be lit when the determination outputs are in their default state. As one of the determination outputs switches from its default state to the opposite state, the corresponding transistor 418 may drive the "go" LED 420 connected to that particular transistor 418. The lit "go" LED 420 may signal to a user that the determination output has switched from its default state, indicating that system 110 may be capable of communicating in the protocol (or protocols) associated with that particular determination output.

Similarly, when the determination outputs are in their default state, the inverses of the determination outputs may be in the opposite state, which may cause transistors 422 to drive "no-go" LEDs 424 to indicate to the user that system 110 may not yet have demonstrated an ability to communicate in the protocols associated with no-go LEDs 424. However, as a determination output is switched out of its default state, the inverse of the determination output may also switch, which may cause the transistor 422 connected to that particular inverse of the determination output to stop driving its associated no-go LED 424.

In some implementations, display module 314 may include an AND gate 426. The inputs of AND gate 426 may be connected to the determination outputs. When all of the determination outputs connected to the inputs of AND gate 426 are switched out of their default state, a system-ok LED 428 may be lit. When system-ok LED 428 is lit, it may signify to the user that system 110 may be capable of communicating in all of the protocols being tested by integrity testing system 118.

Figure 7:
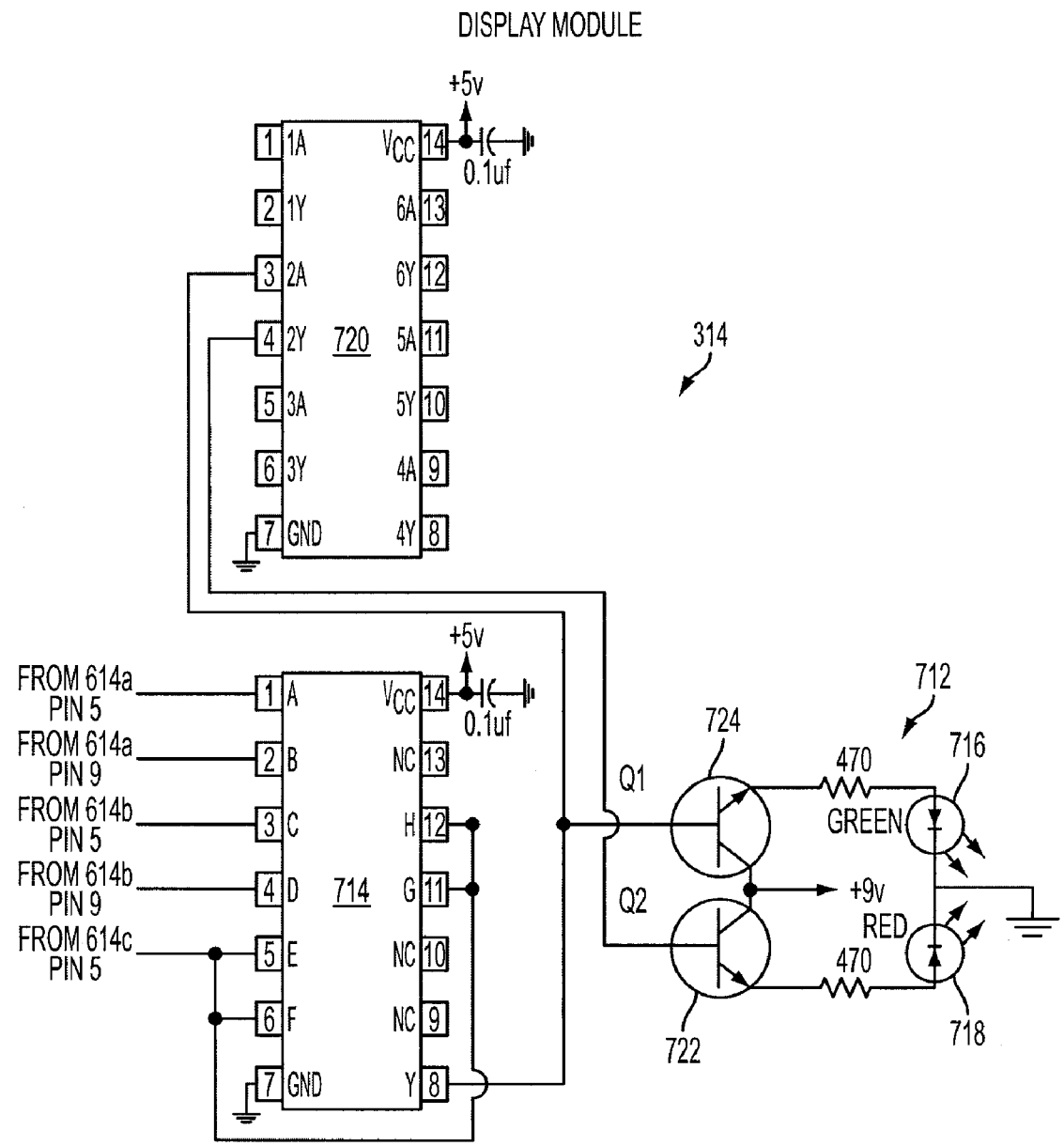
FIG. 7 is an exemplary schematic representation of a wiring diagram of a results/display module associated with an integrity testing system, according to an aspect of the invention.

FIG. 7 is an illustration of an exemplary wiring diagram of display module 314, according to an aspect of the invention. In contrast to the implementation of display module 314 illustrated in FIG. 4, which includes individual indicators (LEDs 420 and 424) for each of the communications protocols being tested for, display module 314 (as illustrated in FIG. 7) includes only an overall indicator 712 similar to system-ok LED 428 of FIG. 4. As shown in FIG. 7, outputs from determination module 312 (e.g., determination module 312 illustrated in FIG. 6) are provided to a logic gate 714. Logic gate 714 may provide similar functionality to AND gate 426 in FIG. 4 by aggregating the individual determinations of determination module 312 with respect to the various communications protocols.

In one implementation, logic gate 714 may include an input NAND gate 74LS30. In the implementation shown in FIG. 7, the output of logic gate 714 is used to drive a system-ok LED 716 and a system-fail LED 718 associated with indicator 712. As should be appreciated from the wiring diagram shown in FIG. 7, when the outputs from determination module 312 are in their default state, the output of logic gate 714, routed through an inverter 720, causes a first transistor 722 to drive system-fail LED 718 to indicate to the user that all of the communications protocols have been received by integrity testing system 118. In one implementation, inverter 720 may include a Hex Schmitt-trigger inverter 74LS14. Further, it should be apparent that when all of the outputs from determination module 312 have been switched out of their default state, the output of logic gate 714 causes a second transistor 724 to drive system-ok LED 716 to indicate to the user that all of the communications protocols have been received by integrity testing system 118. In one implementation, transistors 722 and 724 may include NPN switching transistors 2N2222.

Referring back to FIG. 4, power module 318 may supply some or all of modules 310, 312, 314, and 316 from a power source 430. Power source 430 may include a battery. Power module 318 may supply power from power source 430 across a power switch 432. When power switch 432 is open, power may not be provided by power source 430, but power source 430 may provide power when power switch 432 is closed. A voltage regulator 434 may regulate the voltage of the power provided by power module 318. In some instances, power module 318 may comprise a low battery circuit 435 and a low battery LED 436. Low battery circuit 435 may determine when a power supply of power source 430 may be low, and may activate low battery LED 436 to indicate this condition to the user.

Figure 8:
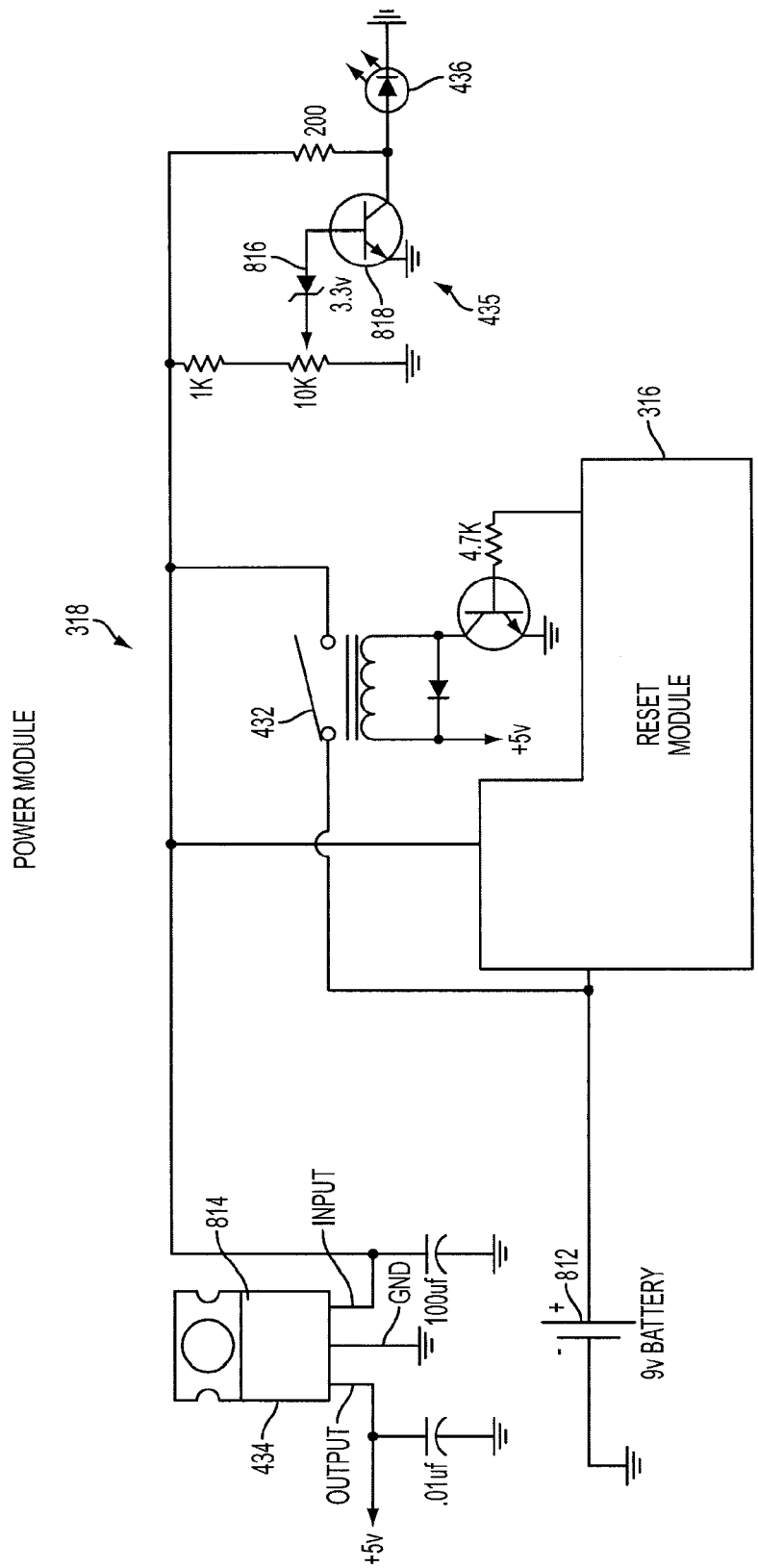
FIG. 8 is an exemplary schematic representation of a wiring diagram of a power module associated with an integrity testing system, according to an aspect of the invention.

FIG. 8 is an illustration of an exemplary wiring diagram of power module 318, according to one aspect of the invention. As illustrated, power source 430 includes a 9V battery 812. Power from 9V battery 812 is supplied across switch 432 to a voltage regulator 814 which functions in substantially the same manner as voltage regulator 434. In one implementation, voltage regulator 814 includes a 3-terminal positive voltage regulator 7805. As can be seen, low battery circuit 435 may also be connected with 9V battery 812, and may drive low battery LED 436 when the power held by 9V battery 812 drops below a predetermined threshold. In one implementation, low battery circuit 435 may include a diode 816 and a transistor 818. Diode 816 may include a 3.3V 1 W Zener Diode 1N4728A. Transistor 818 may include a general purpose transistor 2N3904.

Referring back to FIG. 4, in one implementation of the invention, reset module 316 may include a reset switch 438. Reset switch 438 may be accessible to the user and, upon activation of reset switch 438, processor 122 may be activated. More particularly, activation of reset switch 438 may activate a timer 440, which may cause power switch 432 to be closed for a predetermined amount of time, thereby providing power from power source 430 to processor 122 for the predetermined amount of time. Activation of reset switch 438 may reset the determination outputs to their default states. For example, activating reset switch 438 may trigger resets of digital counters 414 and latches 416 to reset the determination outputs to their default states.

Figure 9:
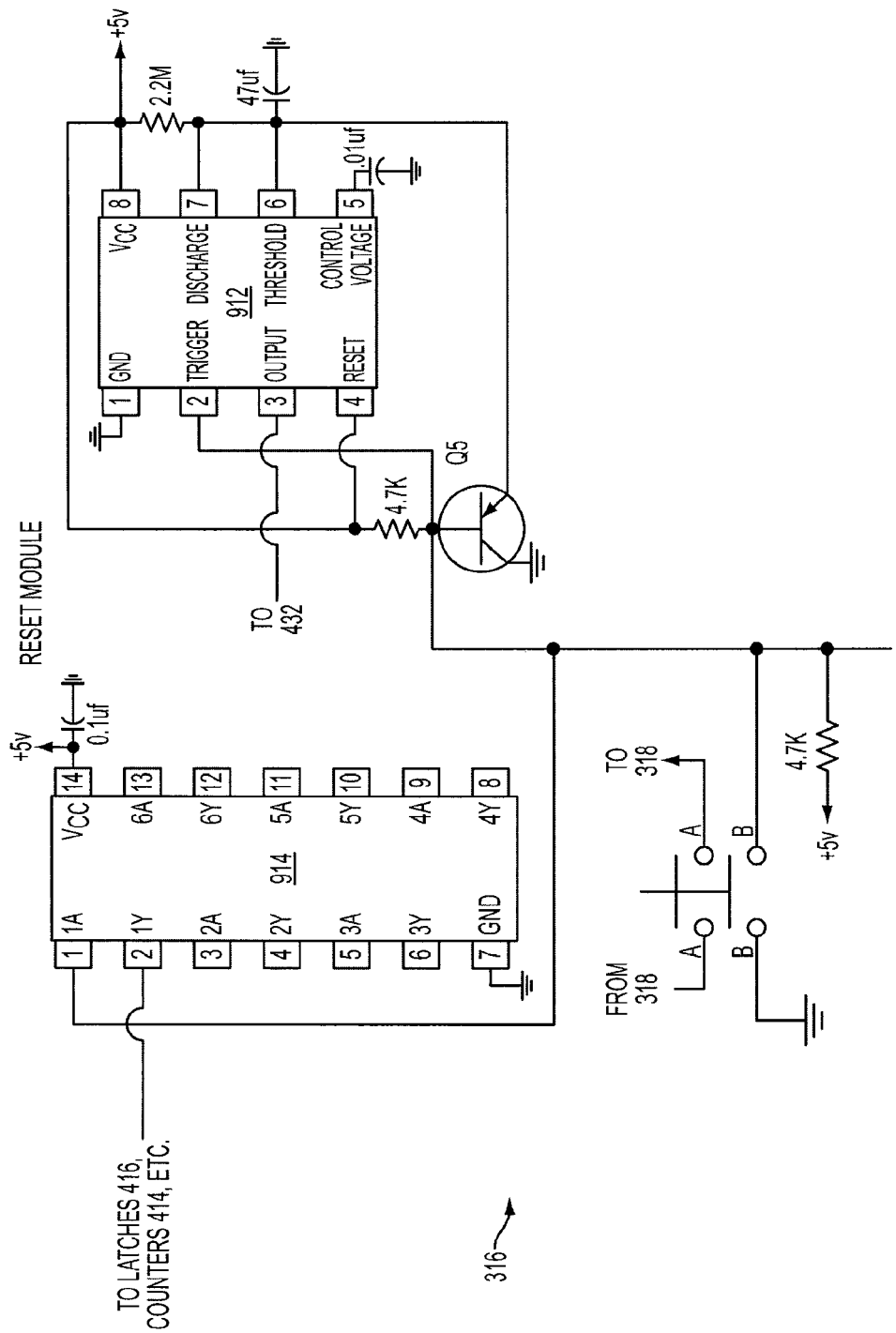
FIG. 9 is an exemplary schematic representation of a wiring diagram of a reset module associated with an integrity testing system, according to an aspect of the invention.

FIG. 9 is an illustration of an exemplary wiring diagram of reset module 316, according to an aspect of the invention. As shown, reset switch 438 may be coupled with a 555 timer 912 that provides the functionality of timer 440. In one embodiment, 555 timer 912 may include a low power single CMOS timer TS555. In the implementation illustrated in FIG. 9, the output of switch 438 may be passed through an inverter 914 before being provided to reset some or all of the various other electronic components of circuit 410 that may be reset by reset switch 438 (e.g., counters 414, latches 416, etc.).

It should be appreciated that the representation of the circuitry of processor 122 shown in FIGS. 4-9 is provided for illustrative purposes only, and that other implementations of processor 122 may exist. For example, in some implementations, some or all of modules 310, 312, 314, 316, and 318 may be implemented as software modules that may be run on one or more computer processing units. In other exemplary implementations, some or all of the functionality of one or more of modules 310, 312, 314, 316, and 318 may be implemented in a programmable chip. For instance, in one embodiment the functionality of determination module 312, results module 314, and/or at least a portion of rest module 316 may be provided by a single programmable chip.

In some implementations, integrity testing system 118 may not test for a uniform set of protocols, but may instead be configurable to test only for one or more protocols specifically selected by a user.

In some implementations, a vehicle testing/diagnostic system and an OBD system may be capable of communicating with one another via an alternate connection to the interface between two data link connectors. For example, the system may be capable of wireless communication. In such implementations, the invention contemplates enabling an integrity testing system to intercept wireless signals being transmitted by the vehicle testing/diagnostic system to confirm the integrity of the vehicle testing/diagnostic system.

Figure 10:
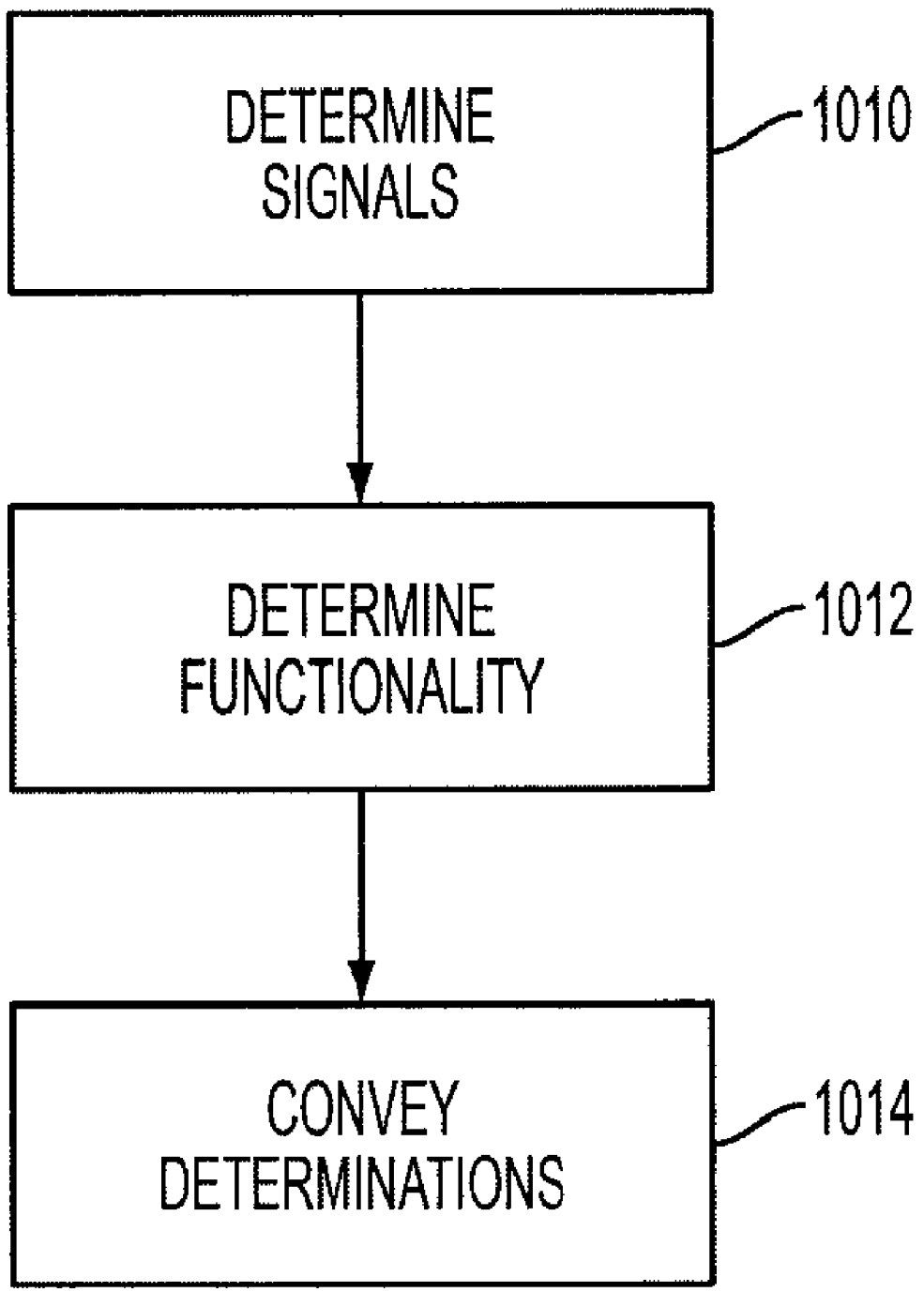
FIG. 10 is an exemplary illustration of a method of testing the integrity of a vehicle testing/diagnostic system, according to an aspect of the invention.

FIG. 10 illustrates a method of determining an ability of a vehicle testing/diagnostic system to communicate according to one or more communications protocols. In an operation 1010, one or more signals may be received from a vehicle testing/diagnostic system. Receiving the signals may include grouping the signals in the manner set forth in detail above.

In an operation 1012, one or more determinations may be made with respect to the ability of the vehicle testing/diagnostic system to communicate according to one or more communications protocols. For example, the determination may include determining whether the vehicle testing/diagnostic system may be capable of communicating in various ones of the one or more communications protocols.

In an operation 1014, the determinations made in operation 1012 may be conveyed to a user. For instance, a visual display may be implemented to convey the determinations to the user.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

What is claimed is:

1. An integrity testing system for testing the integrity of a vehicle testing/diagnostic system that is capable of communicating with an on-board diagnostic system of a vehicle, the integrity testing system comprising:
an integrity testing connector that interfaces with a vehicle testing/diagnostic system;
a receiving module that receives, via the integrity testing connector, signals from the vehicle testing/diagnostic system;
a determination module that determines, based on the signals received by the receiving module, whether the vehicle testing/diagnostic system is capable of communicating with an on-board diagnostic system of the vehicle via one or more predetermined communications protocols; and
a results module that conveys determinations of the determination module to a user.

2. The system of claim 1, wherein the receiving module groups the received signals in accordance with the one or more predetermined communications protocols.

3. The system of claim 1, wherein the integrity testing connector comprises a data link connector.

4. The system of claim 3, wherein the data link connector comprises sixteen cavities adapted to receive sixteen pins of a sixteen-pin connector associated with, an on-board diagnostic system of a vehicle.

5. The system of claim 1, wherein the results module conveys individual determinations as to whether the vehicle testing/diagnostic system is capable of communicating via the one or more predetermined communications protocols.

6. The system of claim 5, wherein the individual determinations comprise an individual determination for each of the one or more predetermined communications protocols.

7. The system of claim 1, wherein the results module conveys an overall determination for the one or more predetermined protocols that is an aggregation of the individual determinations of the one or more predetermined protocols.

8. The system of claim 1, wherein the one or more predetermined protocols comprises one or more of an international standard organization protocol, a keyword protocol, a variable pulse width protocol, a pulse width modulated protocol, or a controller area network protocol.

9. A method of testing the integrity of a vehicle testing/diagnostic system that is capable of communicating with an on-board diagnostic system of a vehicle, the method comprising:
receiving at an integrity testing system, via an integrity testing connector, signals from a vehicle testing/diagnostic system that are intended for an on-board diagnostic system (OBD) of a vehicle;
determining, based on the received signals, whether the vehicle testing/diagnostic system is capable of communicating, via one or more predetermined communications protocols, with an on-board diagnostic system of a vehicle; and
conveying determinations to a user.

10. The method of claim 9, further comprising:
grouping the received signals in accordance with the one or more predetermined communications protocols.

11. The method of claim 9, wherein the connector comprises a data link connector.

12. The method of claim 11, wherein the data link connector comprises sixteen cavities adapted to receive sixteen pins of a sixteen-pin connector associated with an on-board diagnostic system of the vehicle.

13. The method of claim 9, wherein determining comprises making individual determinations as to whether the vehicle testing/diagnostic system is capable of communicating via the one or more predetermined communications protocols.

14. The method of claim 13, wherein the individual determinations comprise an individual determination for each of the one or more predetermined communications protocols.

15. The method of claim 13, wherein conveying the determinations comprises conveying an overall determination for the one or more predetermined protocols that is an aggregation of the individual determinations of the one or more predetermined protocols.

16. The method of claim 9, wherein the one or more predetermined protocols comprises one or more of an international standard organization protocol, a keyword protocol, a variable pulse width protocol, a pulse width modulated protocol, or a controller area network protocol.

* * * * *